BONDING PROCESS

Filed April 30, 1963

Jerrold Cohen
INVENTOR.
BY.
W Hueac Allister Jr.
ATTORNEY.

United States Patent Office 3,298,093
Patented Jan. 17, 1967

3,298,093
BONDING PROCESS

Jerrold Cohen, Costa Mesa, Calif., assignor to Hughes Aircraft Company, Culver City, Calif., a corporation of Delaware Filed Apr. 30, 1963, Ser. No. 276,771
5 Claims. (Cl. 29—473.1)

This invention relates to semiconductor devices and processes therefor. More particularly the invention relates to methods and means for bonding electrodes or support elements and the like to semiconductor bodies which bonding does not require the use of high temperatures in the fabrication and assembly thereof.

In the semiconductor art it is known to use gold as a bonding element or solder for attaching electrodes or support elements to semiconductor bodies of materials such as germanium and silicon. Thus, it is common practice to mount a silicon crystal body on a molybdenum or Kovar stud, for example, by cladding the stud member wth gold and then, after thoroughly cleaning and deoxidizing the contact surfaces of the parts, to press the silicon body into intimate contact with the clad surface of the stud and heat the assembly in a neutral or reducing atmosphere. The silicon body usually alloys to the gold cladding at temperatures of from 600° C. to 700° C.; however, such alloying can be made to occur at lower temperatures (i.e., around 400° C.) if the parts are first subjected to exceptionally thorough cleaning treatments and processes including hand-scrubbing the parts during the alloy steps. It is, of course, desirable to provide such bonding at as low a temperature as possible in order to avoid deleteriously affecting the electrical and semiconductor properties of the semiconductor body, yet the need for exceptionally thorough cleaning and surface preparation adds to the expense of fabricating semiconductor devices at the desired low temperatures.

It is, therefore, an object of the present invention to provide an improved process for bonding components to semiconductor bodies especially of silicon.

Another object of the invention is to provide an improved process for bonding components to semiconductor bodies especially of silicon at low temperatures.

Still another object of the invention is to provide an improved process for inexpensively bonding components to semiconductor bodies at low temperatures and without requiring extensive surface preparation or long periods of heating.

These and other objects and advantages of the invention are achieved by forming a gold-semiconductor alloy layer on the component to be bonded to a semiconductor body. The gold-semiconductor alloy may include the same semiconductor material as that of the semiconductor body. The semiconductor body is then alloyed to the gold-semiconductor alloy layer on the component. In the case of a silicon body this alloy-bonding may be achieved at a temperature of about 450° C.

The invention will be described in greater detail by reference to the drawings in which.

Figure 1:
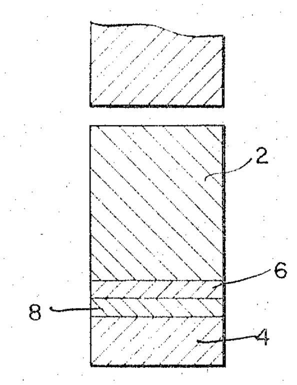
FIGURE 1 is an elevational view in section illustrating the bonding of a stud member to a silicon body.

While the invention may be practiced on both germanium and silicon semiconductor bodies, it will be described herein wtih particular reference to silicon because the alloying problems in connection with silicon are more critical. As used herein the term "bonding" means securing two parts together by an alloying process which includes heating adjacent portions of the parts.

Referring now to the drawings, the first step in the practice of the process of the present invention is to clad with gold the component or stud member 2 which is to be bonded to a silicon body 4. The silicon body 4 may be in the form of a small wafer about .003 centimeter square in area. A suitable technique for cladding the stud member 2 with gold is by electro-plating the stud by conventional techniques.

The second step is to form a silicon-gold alloy on the stud member 2. This may be accomplished by vapor-depositing silicon on the gold layer or plating 6 which was provided on the stud by the previous step. One method for obtaining a vapor-deposited silicon layer is by passing trichlorosilane vapor in a carrier gas of hydrogen over the stud member 2 which is maintained at a temperature of about 1000° C. during the vapor deposition step so that a liquid alloy of gold and silicon forms as the silicon is being deposited. It is desirable to cease the silicon deposition before the gold plating 6 is completely dissolved so as to leave an alloy layer 8 of silicon-gold on top of the gold layer 6.

The stud member 2 is now ready to be bonded to the silicon wafer 4. At this point it may be desirable, although not necessary for successful practice of the process, to lightly plate the surface of the silicon body 4 with gold. This may be achieved by a chemi-plate solution made by mixing and dissolving one gram of potassium gold cyanide in 100 ml. of water to which 5 cc. of hydrofluoric acid is added. The silicon surface is first immersed in hydrofluoric acid to remove any contamination and/or oxide and is then immersed in the chemi-plate solution after which it is removed when the desired plating has been obtained and washed and dried. In practice, a plating of gold on the silicon wafer 4 of the order of about 1000 angstroms in thickness has proved satisfactory. The use of such a gold plating on the silicon wafer 4 is desirable because oxide formation is minimized and the silicon body itself will tend to form a liquid gold-silicon alloy at the surface.

The stud member 2 is then placed in a jig with the silicon wafer 4 so that the silicon-gold layer 8 on the stud member 2 is in contact with the surface of the silicon body 4 or with the gold-plated layer on the silicon body 4 if utilized. A weight is then placed on the stud member to ensure good contact between the stud member 2 and the silicon wafer 4. The assembly is then heated in a neutral or reducing atmosphere to a temperature of about 450° C. for a few minutes. In this way the stud member 2 is firmly bonded to the silicon wafer 4 without the use of an excessively high bonding temperature.

Figure 2:
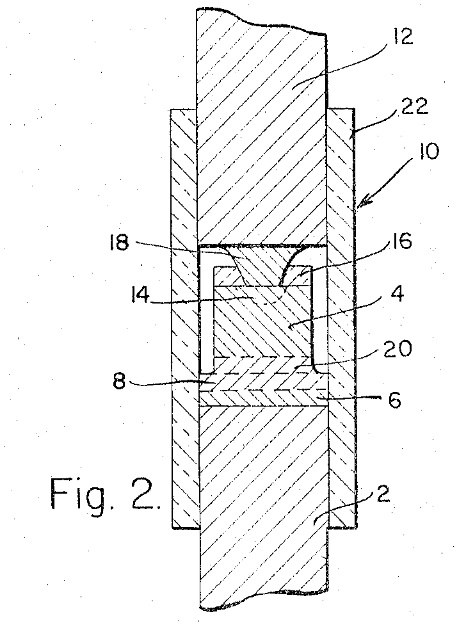
FIGURE 2 is an elevational view in section of a semiconductor device fabricated in accordance with the process of the invention.
Figure 3:
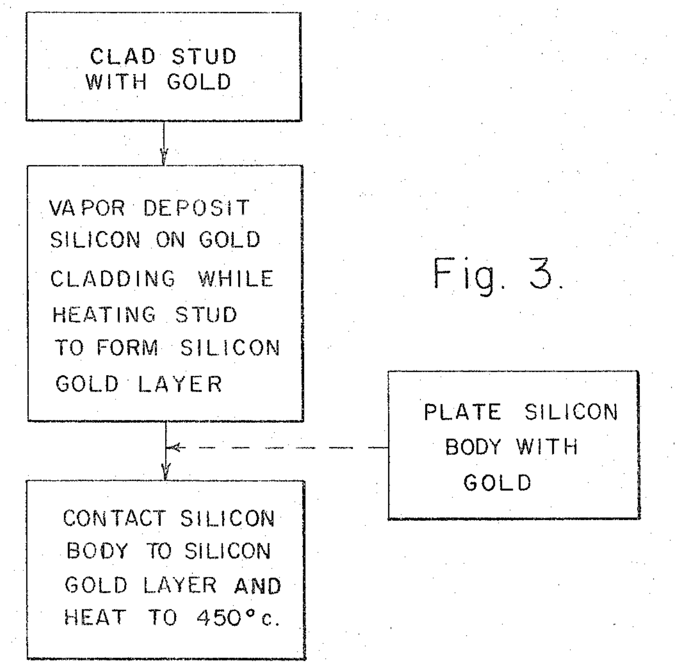
FIGURE 3 is a flow chart of various steps in the method of providing a semiconductor body of silicon with a component bonded thereto in accordance with the invention.

FIGURE 2 shows a silicon diode device 10 comprising stud members 2 and 12 having a silicon die 4 disposed therebetween. The silicon device 10 may be of the PN rectifying junction type in which the bulk portion 4 of the silicon body is of n-type conductivity as may be established by the incorporation of an n-type purity element such as arsenic therein. A p-type region 14 may be established in one surface of the silicon body 4 by diffusing a p-type impurity element such as boron into the surface of the silicon body which is exposed through an opening in an oxide protective mask 16. This technique is well known in the art and need not be further described herein. Electrical connection between the stud member 12 and the p-type region 14 may be provided by alloying a silver solder 18 to the end of the stud 12 and to the p-type region 14 through the opening in the oxide mask 16. The opposite side of the silicon wafer 4 is bonded to the stud member 2 by the process of the invention, there being a gold layer 6 bonded to the stud member 2 and alloyed to the silicon-gold alloy layer 8 which in turn is allowed with a portion of the silicon body 4 to form a further silicon-gold alloy region 20. As shown the stud members 2 and 12 are aligned so as to permit a tubular glass body 22 to be placed around the ends of the stud members 2 and 12 which tubular body is then hermetically fused to the stud members 2 and 12 to complete the diode structure.

What is claimed is:

1. The process of bonding a metallic member to a silicon body comprising the steps of: plating a surface of said metallic member with gold, forming on said metallic member a molten alloy of silicon wth said gold thereon, and bonding said silicon body to said metallic member with said molten gold-silicon alloy.

2. The process of bonding a metallic member to a silicon body comprising the steps of: plating a surface of said metallic member and a surface of said silicon body with gold, forming on said metallic member a molten alloy of silicon with said gold thereon, and bonding said silicon body to said metallic member with said molten gold-silicon alloy and said gold coating on said silicon body.

3. The process of bonding a metallic member to a silicon body comprising the steps of: plating a surface of said metallic member with gold, depositing silicon onto said gold while maintaining said gold at a temperature at which a molten alloy of gold and silicon forms, and bonding said silicon body to said metallic member with said molten gold-silicon alloy.

4. The process of bonding a metallic member to a silicon body comprising the steps of: plating a surface of said metallic member with gold, depositing silicon onto said gold by exposing said gold to the vapor of a compound containing silicon and maintaining said gold at a temperature at which said compound decomposes and said silicon therefrom forms a molten alloy with said gold, and bonding said silicon body to said metallic member with said molten gold-silicon alloy.

5. The process of bonding a metallic member to a silicon body comprising the steps of: plating a surface of said metallic member and a surface of said silicon body with gold, depositing silicon onto said gold on said metallic member while maintaining said gold thereon at a temperature at which a molten alloy of gold and silicon forms, and bonding said silicon body to said metallic member with said molten gold-silicon alloy and said gold on said silicon body.

References Cited by the Examiner

UNITED STATES PATENTS

| | | | |
|---|---|---|---|
| 2,109,485 | 3/1938 | Ihrig | 117—106 X |
| 2,665,998 | 1/1954 | Campbell et al. | 117—106 X |
| 2,771,666 | 11/1956 | Campbell et al. | 29—527 X |
| 2,824,269 | 2/1958 | Ohl | 29—492 X |
| 2,855,328 | 10/1958 | Long | 117—106 |
| 3,050,667 | 8/1962 | Emels | 29—155.5 X |
| 3,063,871 | 11/1962 | Barkemeyer et al. | 117—106 X |
| 3,209,450 | 10/1965 | Klein et al. | 29—498 X |

FOREIGN PATENTS

| | | |
|---|---|---|
| 868,089 | 5/1961 | Great Britain. |

JOHN F. CAMPBELL, *Primary Examiner.*